(12) United States Patent
Okamura

(10) Patent No.: US 7,872,296 B2
(45) Date of Patent: Jan. 18, 2011

(54) SEMICONDUCTOR MEMORY DEVICE

(75) Inventor: Takayuki Okamura, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 275 days.

(21) Appl. No.: 12/166,635

(22) Filed: Jul. 2, 2008

(65) Prior Publication Data
US 2009/0008704 A1 Jan. 8, 2009

(30) Foreign Application Priority Data
Jul. 5, 2007 (JP) ............................. 2007-177598

(51) Int. Cl.
*H01L 29/788* (2006.01)
(52) U.S. Cl. .................. 257/315; 257/314; 257/324; 257/E29.3; 257/E29.309; 257/E21.18; 257/E21.422; 257/E21.423; 257/E21.679
(58) Field of Classification Search ................. 257/314, 257/315, 324, E29.3, E29.309, E21.18, E21.422, 257/E21.423, E21.679
See application file for complete search history.

(56) References Cited

U.S. PATENT DOCUMENTS

| 6,768,158 B2 | 7/2004 | Lee et al. |
| 7,005,700 B2 * | 2/2006 | Lee .............................. 257/316 |
| 7,473,611 B2 * | 1/2009 | Cho et al. .................... 438/381 |
| 7,511,358 B2 * | 3/2009 | Choi et al. ................... 257/618 |
| 2005/0266638 A1 | 12/2005 | Cho et al. |
| 2006/0046388 A1 | 3/2006 | Park et al. |
| 2006/0278915 A1 * | 12/2006 | Lee et al. ..................... 257/315 |
| 2007/0200168 A1 | 8/2007 | Ozawa et al. |

FOREIGN PATENT DOCUMENTS

| JP | 2001-118939 | 4/2001 |
| JP | 2005-243709 | 9/2005 |

OTHER PUBLICATIONS

U.S. Appl. No. 12/038,383, filed Feb. 27, 2008, Toshiharu Watanabe.

* cited by examiner

*Primary Examiner*—N Drew Richards
*Assistant Examiner*—Yu-hsi Sun
(74) *Attorney, Agent, or Firm*—Oblon, Spivak, McClelland, Maier & Neustadt, L.L.P.

(57) ABSTRACT

A semiconductor memory device includes a semiconductor substrate having a projection, an upper end portion of the projection being curved, a first element isolation insulating film formed on the substrate surface at the root of the projection, having an upper surface lower than an upper surface of the projection, a second element isolation insulating film formed in the projection, a gate insulating film formed on the projection, and including a charge storage layer, and a gate electrode formed on the gate insulating film. A height of a first portion where the gate electrode is in contact with the gate insulating film above the upper surface of the first element isolation insulating film is smaller than that of a second portion where the gate electrode is in contact with the gate insulating film above an upper end of the second element isolation insulating film.

20 Claims, 14 Drawing Sheets

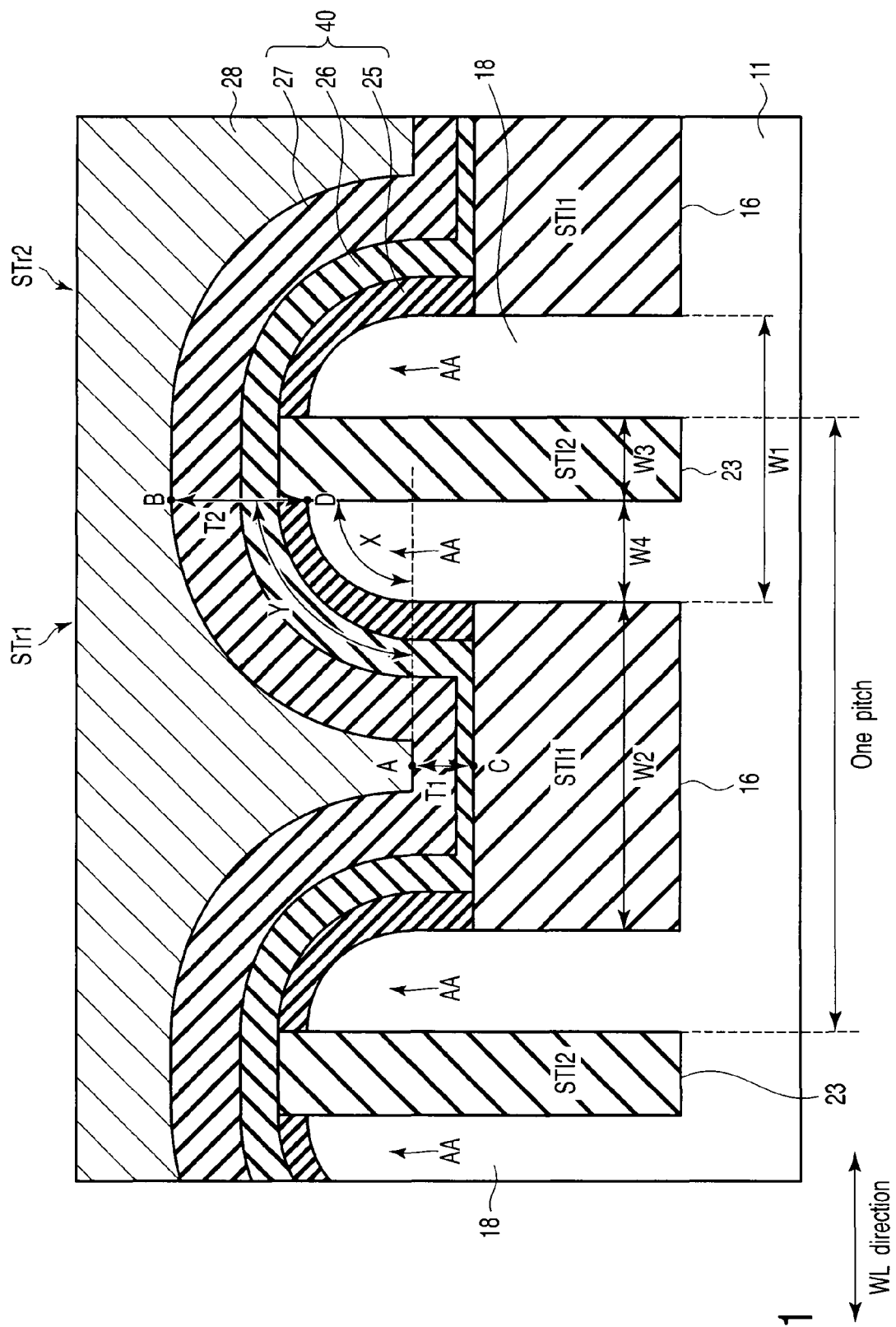
F I G. 1

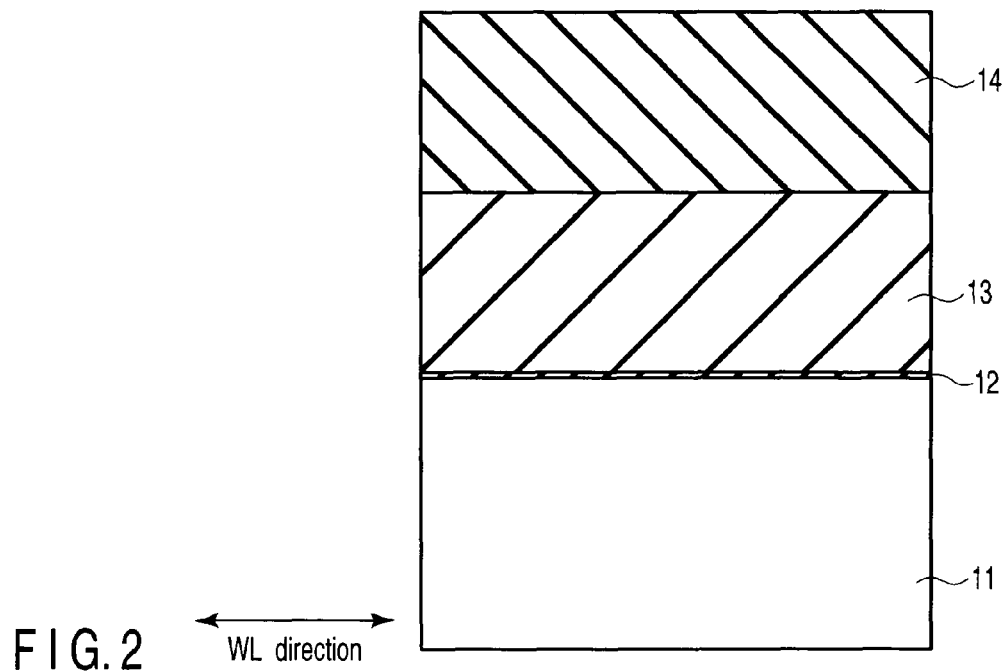
FIG. 2 ← WL direction →
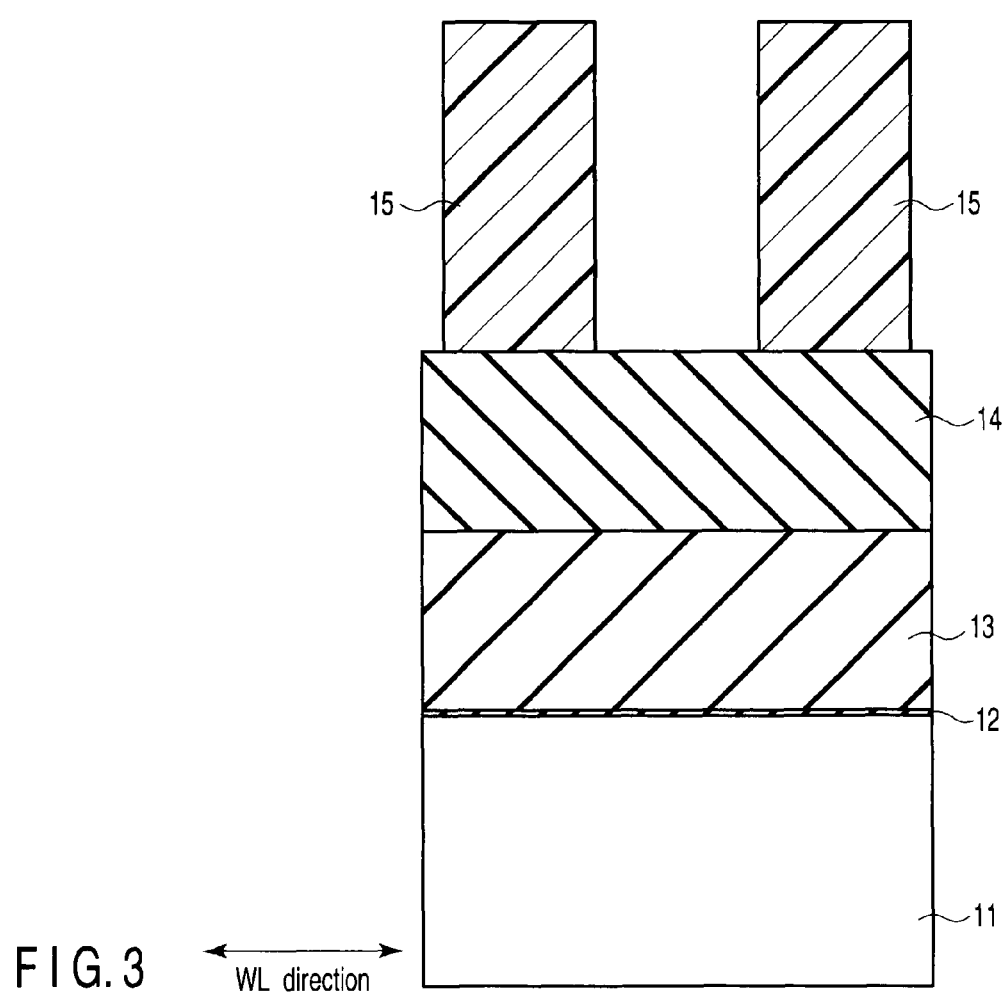
FIG. 3 ← WL direction →

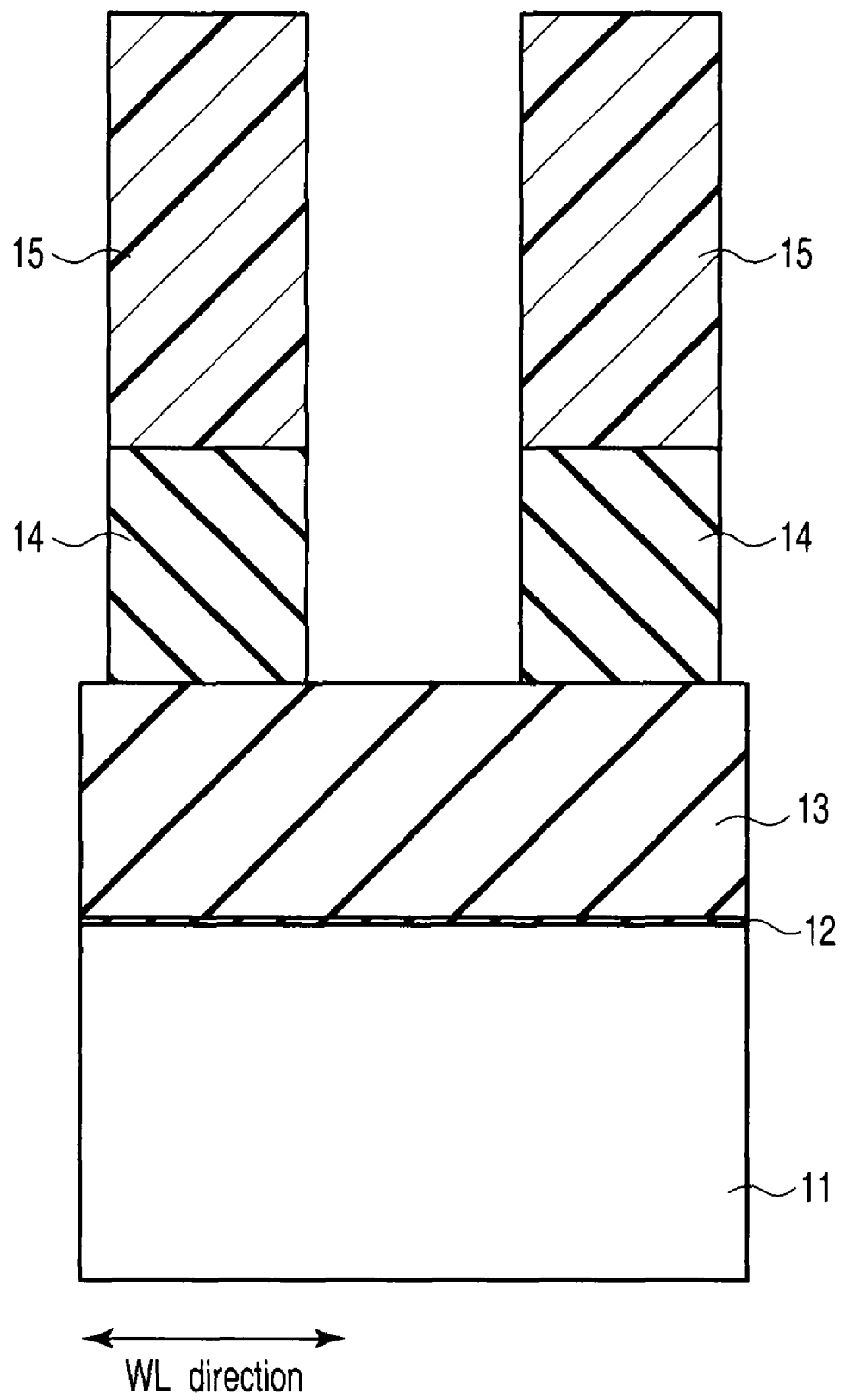
F I G. 4

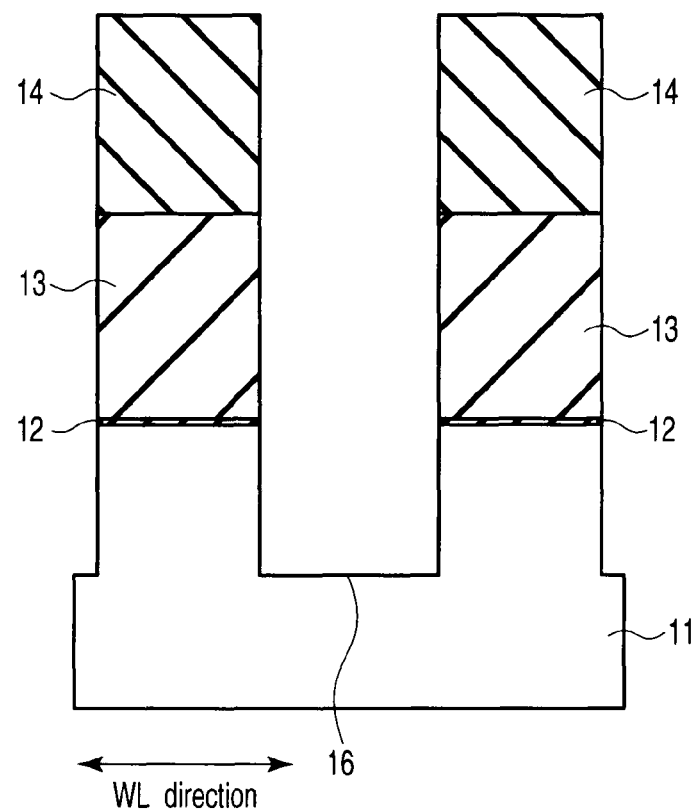
F I G. 5
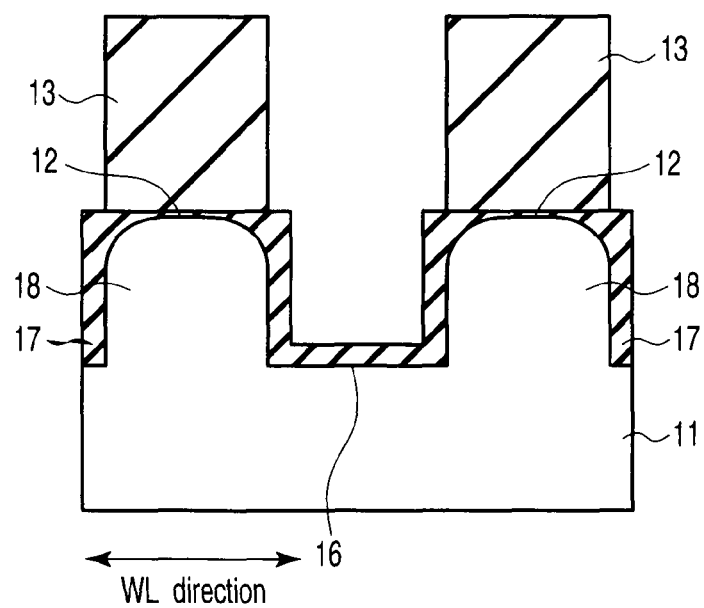
F I G. 6

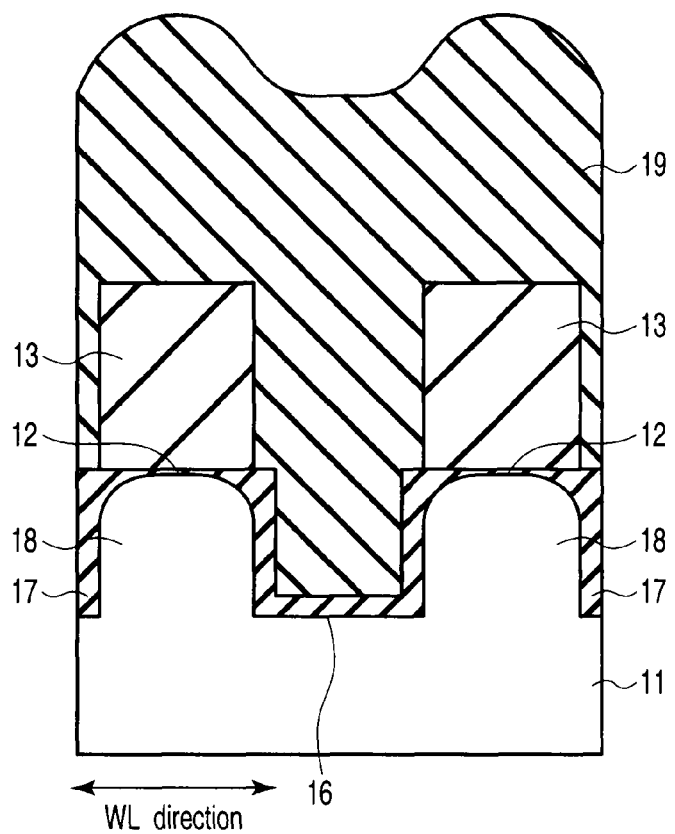
F I G. 7
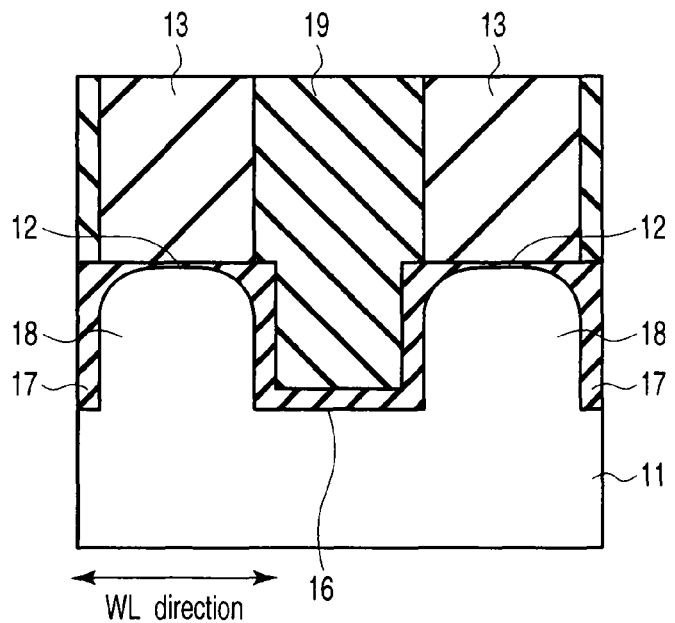
F I G. 8

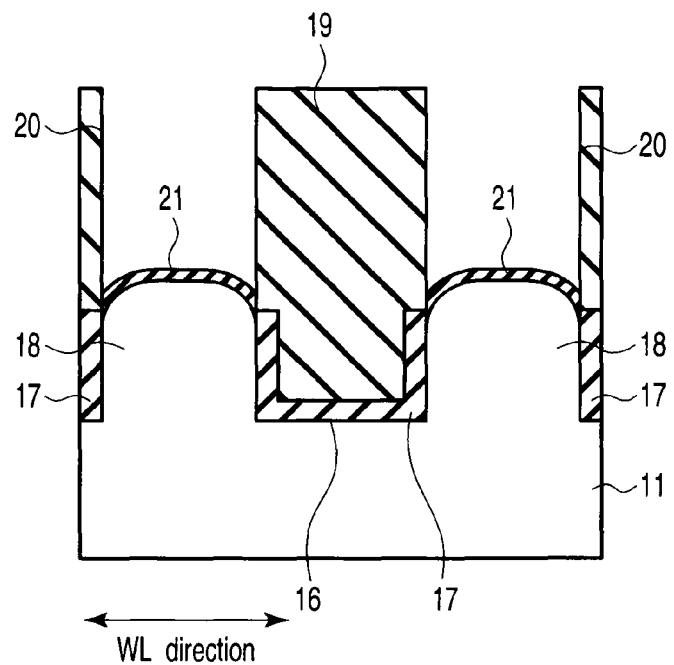
F I G. 9
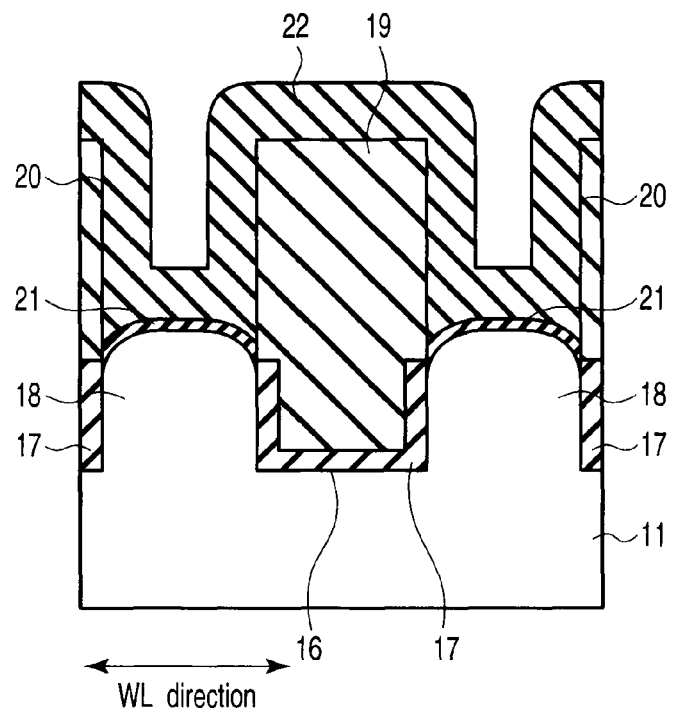
F I G. 10

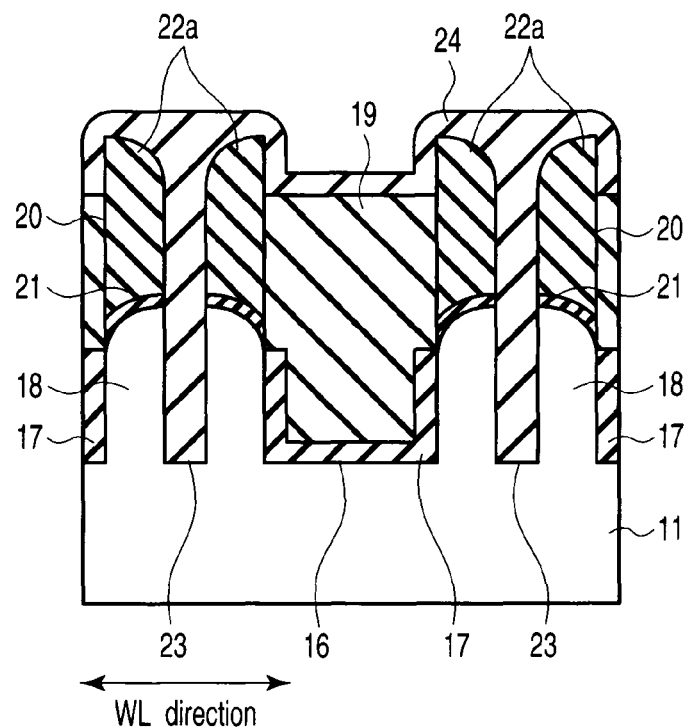
F I G. 1 3
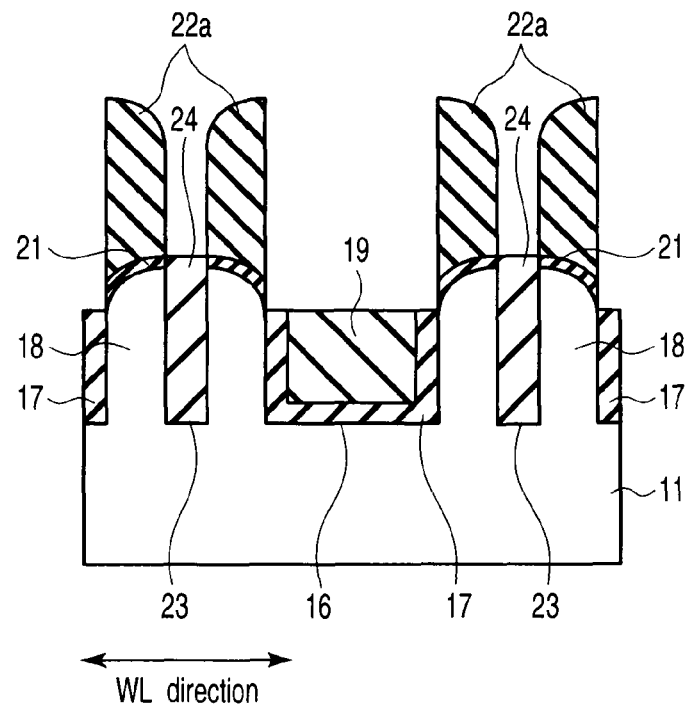
F I G. 1 4

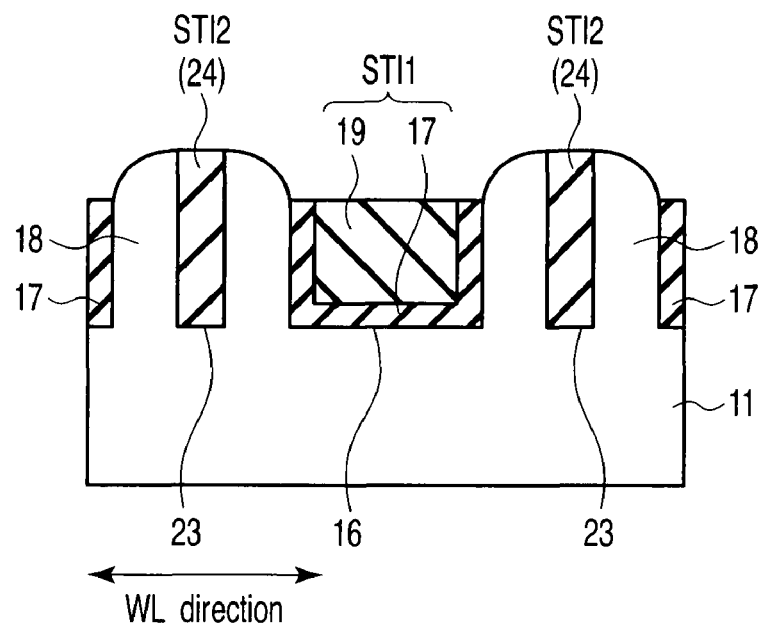
F I G. 15
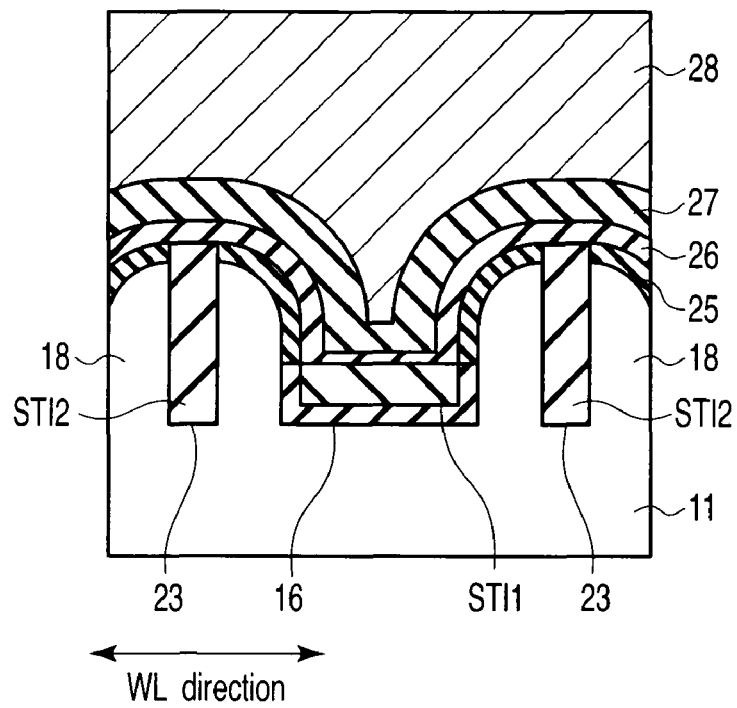
F I G. 16

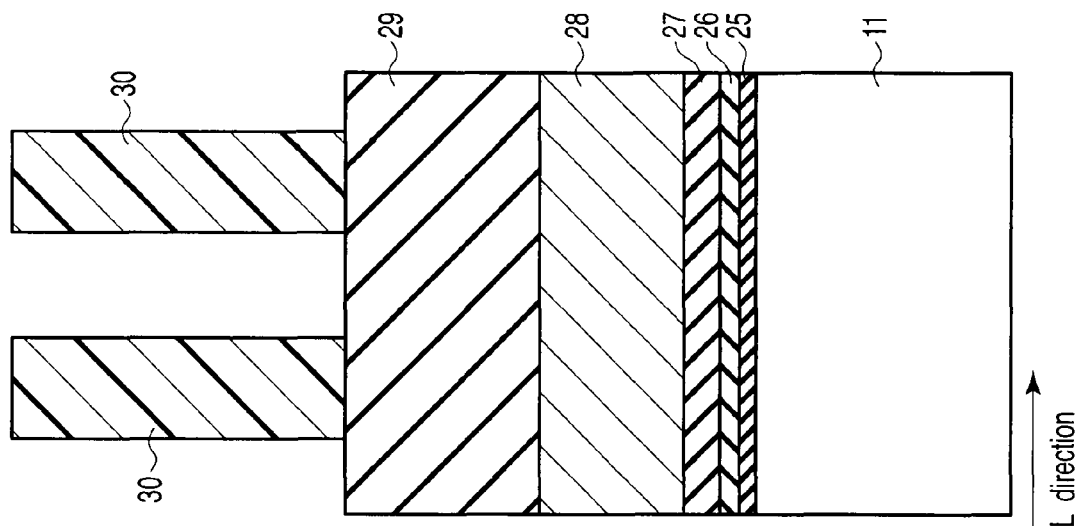
F I G. 17B
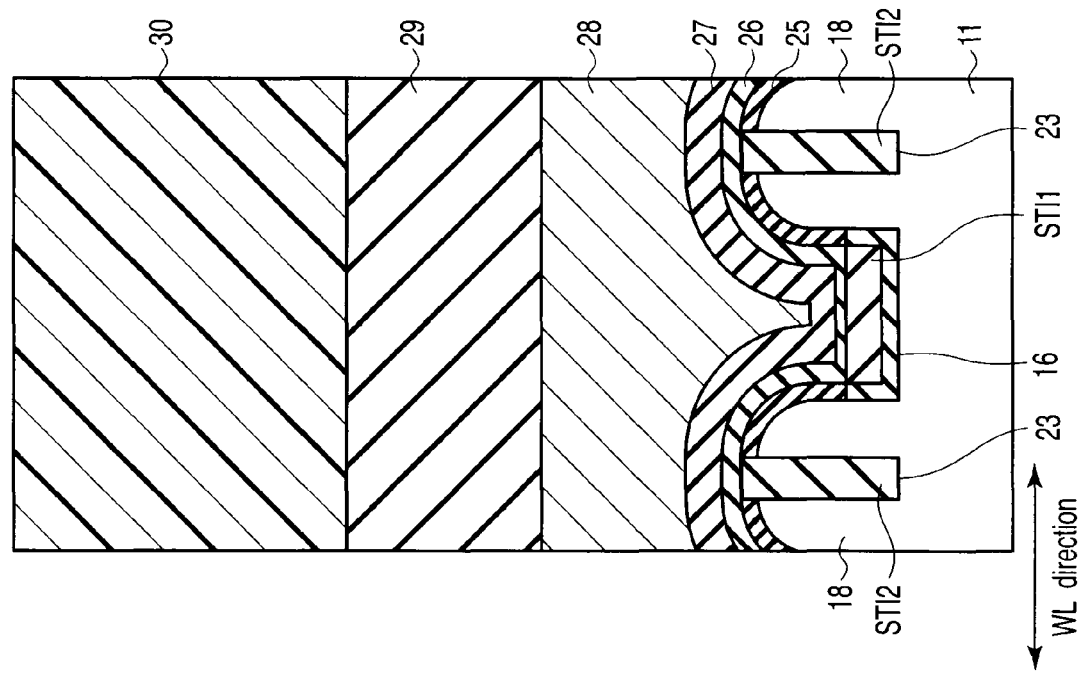
F I G. 17A

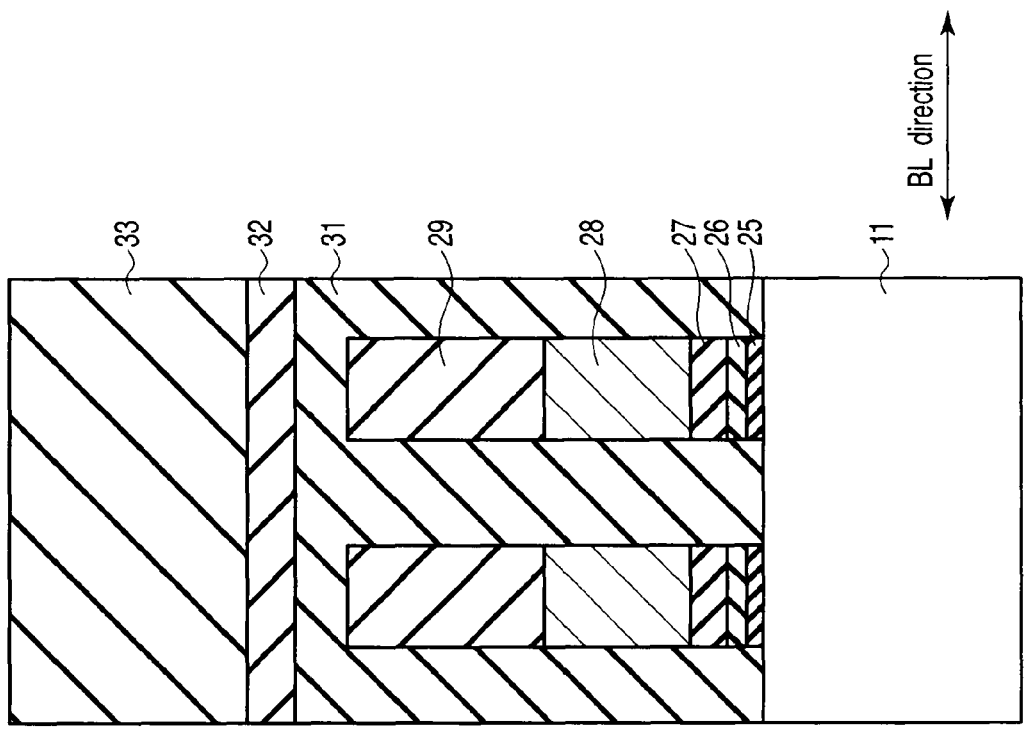
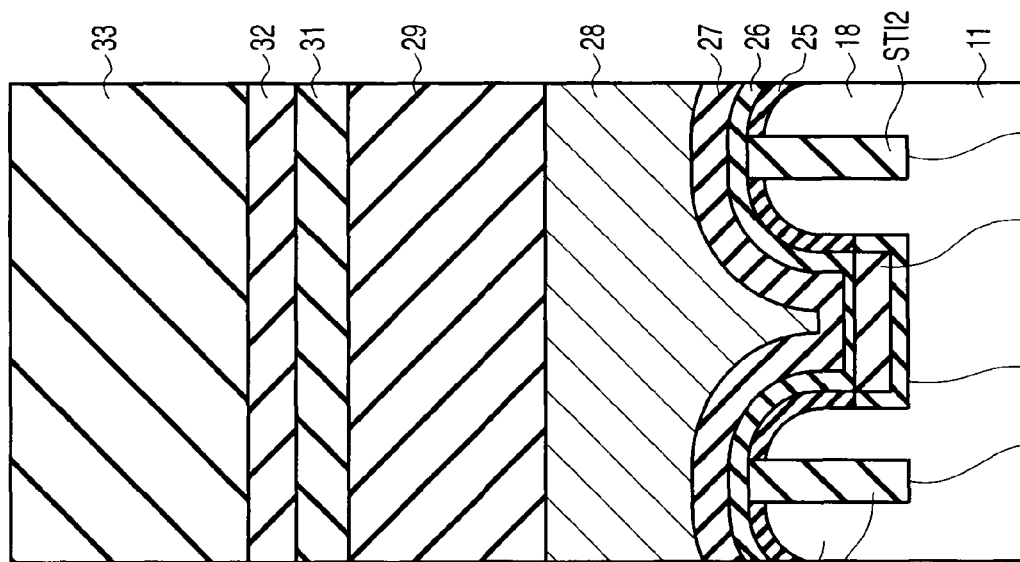
FIG.19A
FIG.19B

SEMICONDUCTOR MEMORY DEVICE

CROSS-REFERENCE TO RELATED APPLICATIONS

This application is based upon and claims the benefit of priority from prior Japanese Patent Application No. 2007-177598, filed Jul. 5, 2007, the entire contents of which are incorporated herein by reference.

BACKGROUND OF THE INVENTION

1. Field of the Invention

The present invention relates to a semiconductor memory device having a cell in which the substrate surface of a channel portion is curbed.

2. Description of the Related Art

As a memory cell of a nonvolatile memory, a cell (to be referred to as a curved cell hereinafter) in which the substrate surface of a channel portion is evenly curved is proposed in, e.g., U.S. Pre-Grant Publication No. 2006/0046388 A1, FIG. 1.

In this curved cell, if the pitch of active areas AA is decreased, a tunnel insulating film, charge storage layer, and block insulating film fill the space between adjacent active areas AA, so the control gate electrode cannot enter this space any longer. This makes it difficult to ensure a large effective channel area and large effective charge storage layer area.

For example, when the film thicknesses of the tunnel insulating film, charge storage layer, and block insulating film are respectively 4, 6, and 10 nm in a nonvolatile memory having a MONOS (Metal-Oxide-Nitride-Oxide-Silicon) structure, if the half pitch of the active areas AA is decreased to about 20 to 25 nm, the channel area and charge storage layer area to which a desired electric field is applied in accordance with a voltage applied to the control gate electrode become smaller than those of a cell (to be referred to as a flat cell hereinafter) having a flat substrate surface.

As described above, micropatterning makes it difficult to secure a large effective channel area and large effective charge storage layer area in the conventional curved cell. This poses the problem that when reading out cell data, it is impossible to obtain a high ON/OFF ratio of a transistor current corresponding to the level of the cell data. In addition, the amount of electric charge injected into the charge storage layer reduces. If charge leakage occurs during data retention, therefore, the influence on the threshold value of a cell transistor increases.

BRIEF SUMMARY OF THE INVENTION

A semiconductor memory device according to the first aspect of the present invention comprising: a semiconductor substrate having a projection projecting from a substrate surface, an upper end portion of the projection being curved, and a root of the projection having a first width; a first element isolation insulating film formed on the substrate surface at the root of the projection, having an upper surface lower than an upper surface of the projection, and having a second width; a second element isolation insulating film formed in the projection, and having a third width smaller than the first width and the second width; a gate insulating film formed on the projection, and including a charge storage layer; and a gate electrode formed on the gate insulating film, wherein a height of a first portion where the gate electrode is in contact with the gate insulating film above the upper surface of the first element isolation insulating film is smaller than that of a second portion where the gate electrode is in contact with the gate insulating film above an upper end of the second element isolation insulating film.

A semiconductor memory device manufacturing method according to the second aspect of the present invention comprising: forming a first element isolation trench having a first width in a semiconductor substrate; forming a projection having a curved upper end portion by oxidizing a surface of the semiconductor substrate; burying a first element isolation insulating film in the first element isolation trench; forming a second element isolation trench having a second width smaller than the first width in the projection; burying a second element isolation insulating film in the second element isolation trench; removing upper portions of the first element isolation insulating film and the second element isolation insulating film, making an upper surface of the first element isolation insulating film lower than that of the second element isolation insulating film; forming a gate insulating film on the projection, the first element isolation insulating film, and the second element isolation insulating film; and forming a gate electrode on the gate insulating film.

BRIEF DESCRIPTION OF THE SEVERAL VIEWS OF THE DRAWING

FIG. 1 is a sectional view showing a memory cell of a flash memory according to an embodiment of the present invention;

FIGS. 2 to 16, 17A, 17B, 18A, 18B, 19A, and 19B are sectional views showing the manufacturing steps of the memory cell of the flash memory according to the embodiment of the present invention;

DETAILED DESCRIPTION OF THE INVENTION

Figure 11:
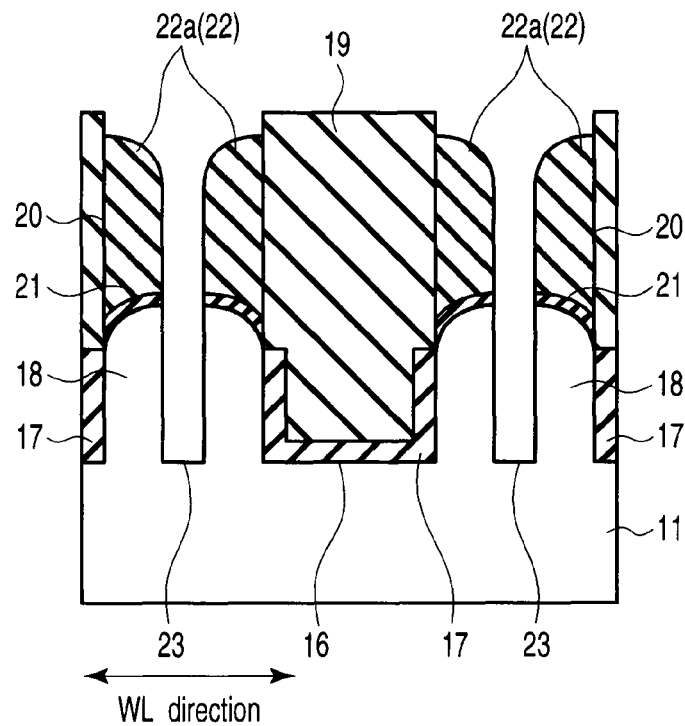

An embodiment of the present invention will be explained below with reference to the accompanying drawing. In the following explanation, the same reference numerals denote the same parts throughout the drawing.

[1] Structure of Memory Cell

FIG. 1 is a sectional view showing a memory cell of a flash memory according to the embodiment of the present invention. The structure of the memory cell will be explained below by taking a MONOS flash memory as an example of a semiconductor memory device. However, this embodiment is not limited to a MONOS memory and also applicable to a floating gate memory. Also, this embodiment can be applied to, e.g., a NAND flash memory and NOR flash memory.

As shown in FIG. 1, projections 18 projecting from the substrate surface are formed on a semiconductor substrate (e.g., a silicon substrate) 11. The upper end portion of each projection 18 is curved. Two cell transistors STr1 and STr2 are formed on the curved projection 18. The cell transistors STr1 and STr2 each comprise a gate insulating film 40 and control gate electrode 28. The gate insulating film 40 includes a tunnel insulating film 25, charge storage layer 26, and block insulating film 27. In this manner, 2-bit memory cells having the curved portions of the projection 18 as active areas AA are formed for the projection 18.

In the semiconductor substrate 11, first and second element isolation insulating films STI1 and STI2 having an STI (Shallow Trench Isolation) structure are alternately formed in a WL direction (a direction in which the control gate electrode 28 extends) so as to sandwich the active areas AA between them. The first element isolation insulating film STI1 is formed on the substrate surface at the root of the projection 18, and buried in an element isolation trench 16. The second element isolation insulating film STI2 is formed in the projection 18 to isolate the active areas AA of the cell transistors STr1 and STr2. Each active area AA curves toward the first element isolation insulating film STI1, and the curvature on the side of the second element isolation insulating film STI2 is smaller than that on the side of the first element isolation insulating film STI1.

Assume that the distance between the right side surfaces of the second element isolation insulating films STI2 adjacent to each other with the first element isolation insulating film STI1 being interposed between them is one pitch. In this case, a width W2 of the first element isolation insulating film STI1 in the WL direction is larger than the half pitch, and a width W3 of the second element isolation insulating film STI2 in the WL direction is smaller than the half pitch. Accordingly, the widths W2 and W3 of the first and second element isolation insulating films STI1 and STI2 in the WL direction are different. The width W3 of the second element isolation insulating film STI2 is smaller than a width W1 of the projection 18 in the WL direction and the width W2 of the first element isolation insulating film STI1 in the WL direction.

A width W4 of the active area AA in the WL direction is made smaller than the half pitch so that the control gate electrode 28 well enters between adjacent active areas AA on the first element isolation insulating film STI1. This makes it possible to increase an effective channel width X and a width Y of the charge storage layer 26.

The height of an upper surface C of the first element isolation insulating film STI1 is smaller than that of an upper surface of the second element isolation insulating film STI2. The depths of the bottom surfaces of the first and second element isolation insulating films STI1 and STI2 may be the same or different.

The height of a first portion A where the control gate electrode 28 is in contact with the block insulating film 27 above the upper surface C of the first element isolation insulating film STI1 is lower than that of a second portion B where the control gate electrode 28 is in contact with the block insulating film 27 above the upper end of the second element isolation insulating film STI2. The height of the first portion A is desirably smaller than that of the upper surface (the upper surface D of the projection 18) of the second element isolation insulating film STI2. Thus, the control gate electrode 28 enters between adjacent projections 18.

A film thickness T1 of the gate insulating film 40 in the first portion A is smaller than a film thickness T2 of the gate insulating film 40 in the second portion B. More specifically, a three-layered structure including the tunnel insulating film 25, charge storage layer 26, and block insulating film 27 is formed on the upper surface of the second element isolation insulating film STI2, whereas a two-layered structure excluding the tunnel insulating film 25 and including the charge storage layer 26 and block insulating film 27 is formed on the upper surface of the first element isolation insulating film STI1. This film thickness relationship allows the control gate electrode 28 to well enter between adjacent projections 18. Note that when the gate insulating film 40 is a three-layered tunnel film such as an ONO film or OAO film, a film formation process such as ALD is used, so the insulating film 25 may also be formed on the first element isolation insulating film STI1.

Each tunnel insulating film 25 covers the upper and side surfaces of the projection 18. The tunnel insulating films 25 are spaced apart from each other for every projection 18 (every two cells) and the second element isolation insulating film STI2 in the WL direction. However, the tunnel insulating film 25 may also be formed on the first element isolation insulating film STI1 and the second element isolation insulating film STI2 so as to extend across adjacent projections 18.

The charge storage layer 26 is formed to extend across adjacent projections 18. Referring to FIG. 1, the charge storage layer 26 is in direct contact with the first element isolation insulating film STI1 and the second element isolation insulating film STI2 because the tunnel insulating film 25 is not formed on the first element isolation insulating film STI1 and the second element isolation insulating film STI2. Note that the charge storage layer 26 may also be cut for every projection 18 (every two cells) or for every cell in the WL direction.

The block insulating film 27 is formed to extend across adjacent projections 18. Note that the block insulating film 27 may also be cut for every projection 18 (every two cells) or for every cell in the WL direction.

The cell transistors STr1 and STr2 described above are made of, e.g., the following materials. The tunnel insulating film 25 is made of an Si oxide film ($SiO_2$ film), the charge storage layer 26 is made of an Si nitride film (SiN film), the block insulating film 27 is made of an Al oxide film ($Al_2O_3$ film), and the control gate electrode 28 is made of a metal such as TaN or polysilicon. When these materials are used, the film thicknesses of the tunnel insulating film 25, charge storage layer 26, and block insulating film 27 are respectively, e.g., 4, 6, and 10 nm. Accordingly, the tunnel insulating film 25, charge storage layer 26, and block insulating film 27 become thicker in the order named.

Note that the materials of the cell transistors STr1 and STr2 are not limited to those described above, and can be variously changed.

For example, as the tunnel insulating film 25, it is possible to apply a three-layered film including $SiO_2$, SiN, and $SiO_2$, a three-layered film including $SiO_2$, $Al_2O_3$, and $SiO_2$, a two-layered film including SiON and $SiO_2$, or a three-layered film including $SiO_2$, Si having film thickness of 2 nm or less, and $SiO_2$.

As the charge storage layer 26, it is possible to apply HfAlO, HfON, HfSiN, or a stacked film of $Al_2O_3$ and SiN.

As the block insulating film 27, it is possible to apply a stacked film of $Al_2O_3$ and $SiO_2$, or a film containing LaAlO or LaAlSiO.

As the control gate electrode 28, it is possible to apply a metal material containing CoSi, NiSi, or TaN.

Furthermore, the pitch of the active areas AA, the width W2 of the first element isolation insulating film STI1, the width W3 of the second element isolation insulating film STI2, and the materials and film thicknesses of the tunnel insulating film 25, charge storage layer 26, block insulating film 27, and control gate electrode 28 can be changed within ranges over which these components can achieve their effects.

[2] Manufacturing Method

Figure 18B:
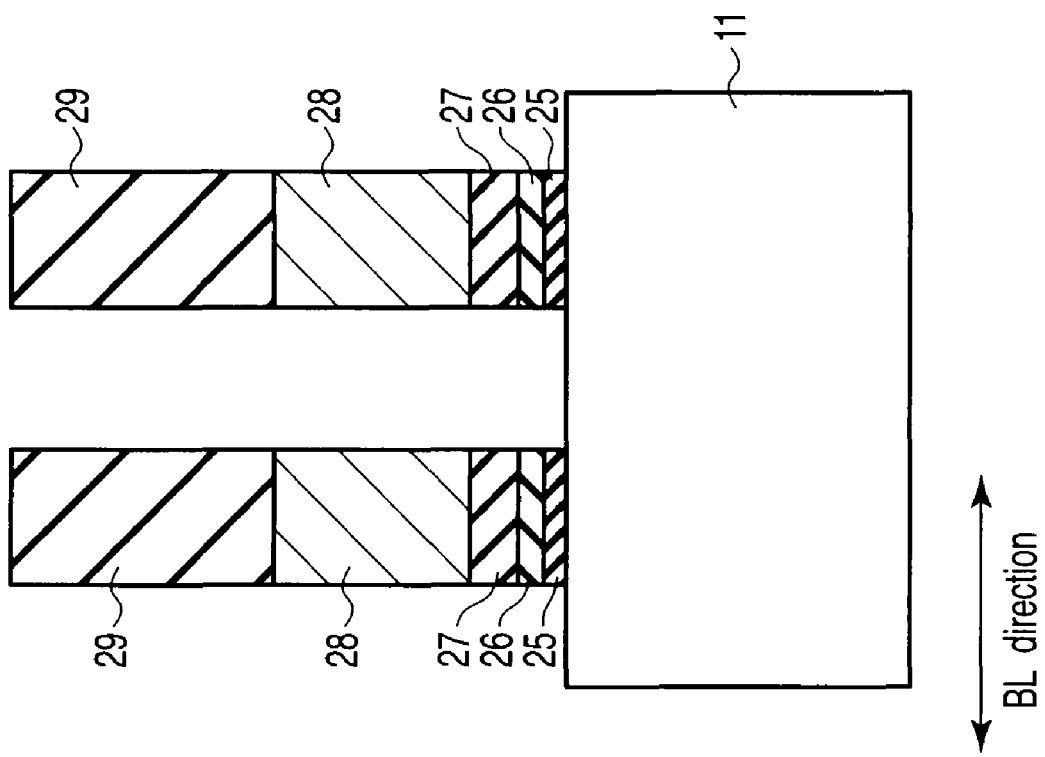

FIGS. 2 to 19A and 19B are sectional views showing the manufacturing steps of the memory cell of the flash memory according to the embodiment of the present invention. FIGS. 2 to 16, 17A, 18A, and 19A illustrate sections in the WL direction (perpendicular to the active area AA). FIGS. 17B, 18B, and 19B illustrate sections in a BL direction (perpendicular to the WL direction). A method of manufacturing the memory cell will be explained below, and a method of manufacturing a peripheral circuit portion and the like will also be properly explained.

Lithography and an ion implantation process are used to adjust the impurity concentrations and profiles of a well portion and channel portion to desired values. After that, a gate insulating film (not shown) and a gate electrode (not shown) made of polysilicon are formed in the peripheral circuit portion.

As shown in FIG. 2, an $SiO_2$ film 12 is formed on a semiconductor substrate 11 made of, e.g., silicon by oxidizing the surface of the semiconductor substrate 11. Subsequently, an SiN film 13 and BSG (Boron Silicate Glass) film 14 are sequentially formed on the $SiO_2$ film 12 by CVD (Chemical Vapor Deposition). The film thickness of the SiN film 13 is set to a necessary thickness since this film thickness determines the height of masks 22a when forming a narrow element isolation trench 23 in a step shown in FIG. 11 (to be described later).

As shown in FIG. 3, the BSG film 14 is coated with a resist 15, and the resist 15 is patterned by lithography.

As shown in FIG. 4, the resists 15 are used as masks to remove the BSG film 14 by anisotropic etching such as RIE (Reactive Ion Etching). After that, the resists 15 are removed.

As shown in FIG. 5, the BSG films 14 are used as masks to remove the SiN film 13, $SiO_2$ film 12, and semiconductor substrate 11 by anisotropic etching such as RIE. Consequently, a wide element isolation trench 16 is formed in the semiconductor substrate 11. In this step, an element isolation trench (not shown) is also formed in the peripheral circuit portion. The depth of the element isolation trench 16 is a depth required for element isolation between a memory cell array portion and the peripheral circuit portion. After that, the BSG films 14 are removed by isotropic etching such as wet etching.

As shown in FIG. 6, the semiconductor substrate 11 is oxidized into the form of a bird's beak, and an $SiO_2$ film 17 is formed on the surface of the semiconductor substrate 11. Accordingly, projections 18 having curved upper end portions are formed on the semiconductor substrate 11. Note that hydrogen annealing or the like may also be performed as needed before bird's beak oxidation. Note also that the peripheral circuit portion, a selection gate portion, and the like may also be covered with a mask made of an SiN film or the like as needed before bird's beak oxidation.

As shown in FIG. 7, the element isolation trench 16 in the memory cell array portion is filled with, e.g., $SiO_2$ film 19. In this step, the element isolation trench (not shown) in the peripheral circuit portion is also filled with the $SiO_2$ film 19.

As shown in FIG. 8, the SiN films 13 are exposed by planarizing the $SiO_2$ film 19 by CMP (Chemical Mechanical Polish).

As shown in FIG. 9, the SiN films 13 on the projections 18 are removed by isotropic etching such as wet etching, thereby forming trenches 20. The projections 18 are once exposed by etching away the $SiO_2$ film 12 and 17 on the projections 18. After that, thin $SiO_2$ films 21 are formed by oxidizing the exposed surfaces of the projections 18.

As shown in FIG. 10, an SiN film 22 is continuously deposited on the side and bottom surfaces of the trenches 20 and on the $SiO_2$ film 19 by CVD. The film thickness of the SiN film 22 determines the width of a prospective region of an active area AA, and hence is set to a desired width of an active area AA.

As shown in FIG. 11, the $SiO_2$ films 19 and 21 are exposed by etching back the SiN film 22. As a consequence, masks 22a are formed on the sidewalls of the trenches 20 (the sidewalls of the $SiO_2$ films 19). The masks 22a and $SiO_2$ films 19 are then used as masks to remove the projections 18 of the semiconductor substrate 11 by anisotropic etching such as RIE, thereby forming narrow element isolation trenches 23. Similar to the element isolation trench 16, the depth of the element isolation trenches 23 is set to a depth necessary for element isolation. For example, the depth of the element isolation trenches 23 is the same as that of the element isolation trench 16.

Figure 12:
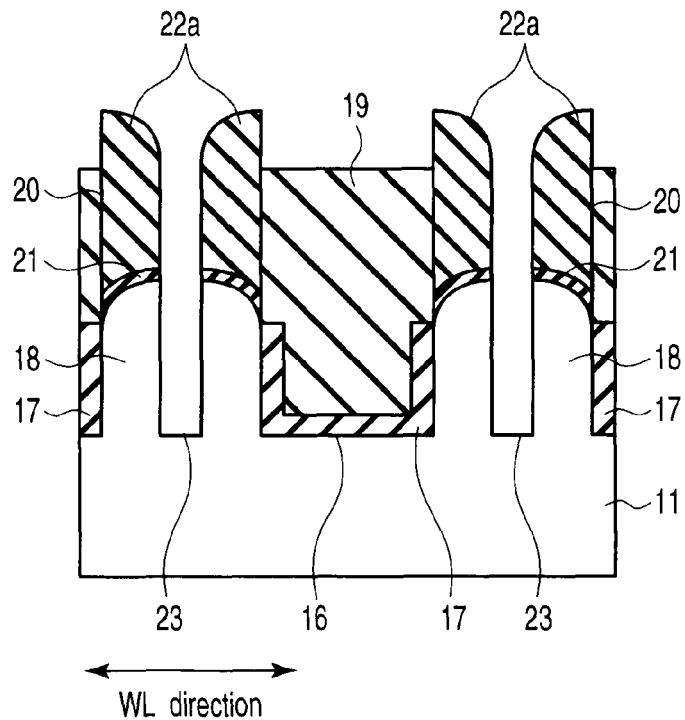

As shown in FIG. 12, lithography is used to selectively etch the upper portion of the $SiO_2$ film 19 buried in the element isolation trench 16 in the memory cell array portion. Consequently, the upper surface of the $SiO_2$ film 19 is made lower than that of the mask 22a. This step is performed in order to make the upper surface of the $SiO_2$ film 19 finally serving as an element isolation insulating film STI1 lower than the curved portion of the projection 18 in a step shown in FIG. 14 (to be described below).

As shown in FIG. 13, $SiO_2$ films 24 are buried in the element isolation trenches 23.

As shown in FIG. 14, the $SiO_2$ films 19 and 24 are etched to a desired height. This lowers the upper surface of the $SiO_2$ film 24 to the upper end of the curved portion of the projection 18, and lowers the upper surface of the $SiO_2$ film 19 to the lower end of the curved portion of the projection 18.

As shown in FIG. 15, the masks 22a and the $SiO_2$ films 21 formed below the masks 22a are removed by isotropic etching such as wet etching, thereby exposing the curved portions of the projections 18. Consequently, a wide element isolation insulating film STI1 is formed between adjacent projections 18, and a narrow element isolation insulating film STI2 is formed in each projection 18.

As shown in FIG. 16, a tunnel insulating film 25 such as an oxide film, a charge storage layer 26 such as an SiN film, and a block insulating film 27 such as an $Al_2O_3$ film are sequentially deposited on the memory cell array portion and peripheral circuit portion. The tunnel insulating film 25 is formed by the thermal oxidation or the like. Accordingly, the tunnel insulating film 25 is formed at the exposed curved portion of the projection 18. In the peripheral circuit portion, the block insulating film 27, charge storage layer 26, and tunnel insulating film 25 are selectively removed by lithography, thereby exposing a preformed gate electrode (not shown). After that, a gate electrode 28 made of impurity-doped polysilicon or metal is deposited on the block insulating film 27 in the memory cell array portion and peripheral circuit portion.

As shown in FIGS. 17A and 17B, a mask 29 made of SiN or the like is deposited on the gate electrode 28, and coated with a resist 30. The resist 30 is then patterned by lithography.

Figure 18A:
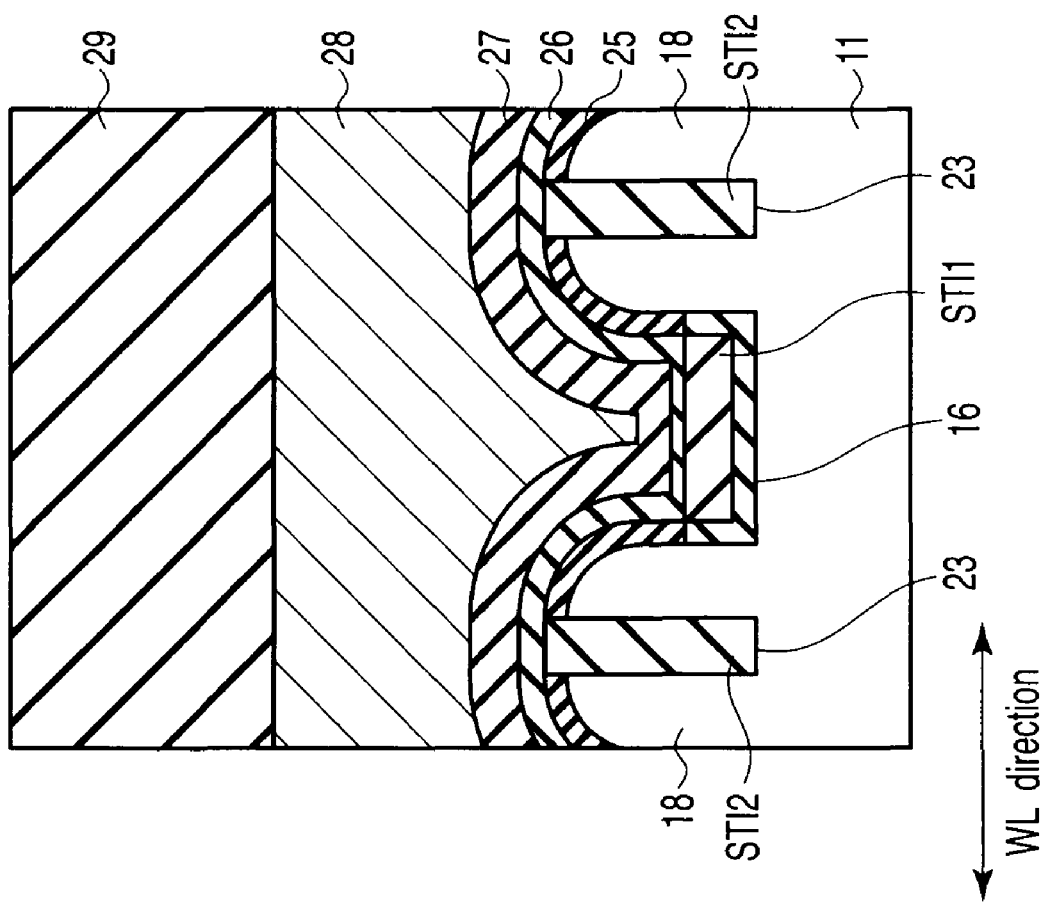

As shown in FIGS. 18A and 18B, the mask 29 is patterned, and the resists 30 are removed. The patterned masks 29 are used to remove the gate electrode 28, block insulating film 27, and charge storage layer 26 by anisotropic etching such as RIE. Subsequently, the gate electrode 28 and tunnel insulating film 25 are patterned. After that, source/drain diffusion layers (not shown) are formed in source/drain portions by ion implantation.

As shown in FIGS. 19A and 19B, an $SiO_2$ film 31 is buried between the gates. An SiN film 32 is deposited on the memory cell array, and an $SiO_2$ film 33 is formed on the SiN film 32. After that, contacts, interconnection layers, passivation films, pads, and the like (none of them are shown) necessary to operate the memory cell array are formed.

[3] Effective Channel Width

Figure 20:
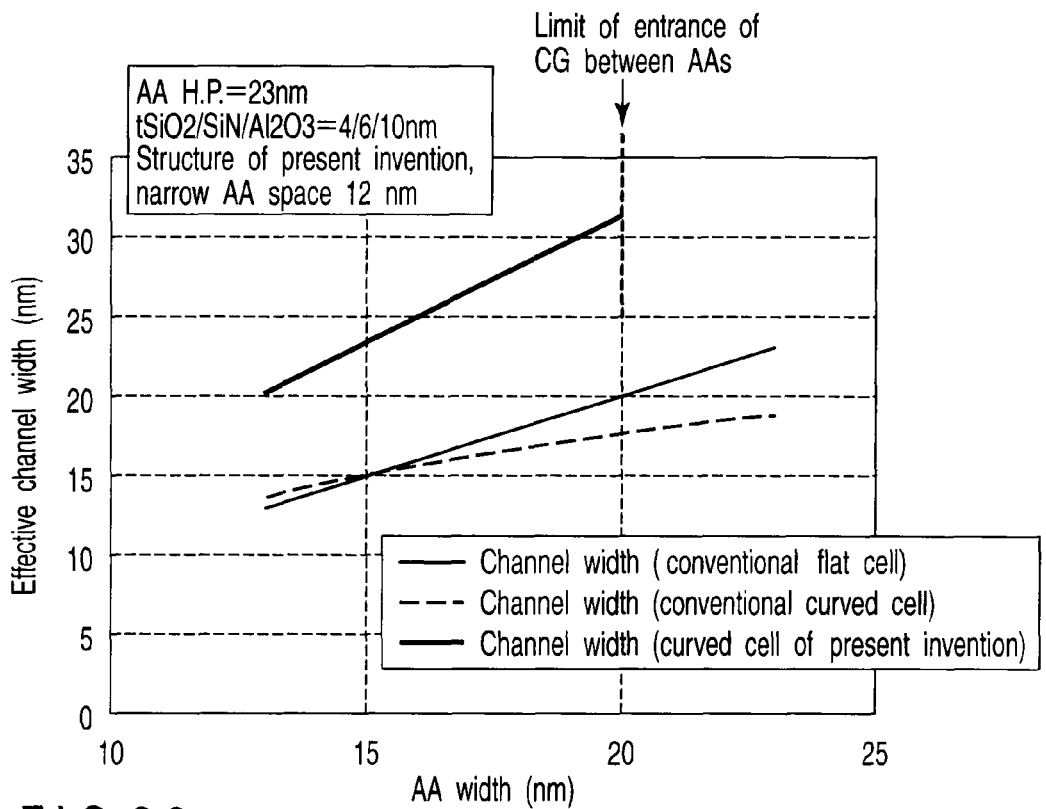
FIG. 20 is a graph showing the effective channel width as a function of the active area width, for each of a curved cell of the embodiment, a conventional curved cell, and a conventional flat cell.

FIG. 20 is a graph showing the effective channel width as a function of the active area width, for each of the curved cell of this embodiment, a conventional curved cell, and a conventional flat cell. The half pitch (AA-H.P.) of the active area AA is 23 nm, the film thickness of the tunnel insulating film ($SiO_2$) is 4 nm, that of the charge storage layer (SiN) is 6 nm, and that of the block insulating film ($Al_2O_3$) is 10 nm. Note that the channel width corresponds to X in FIG. 1, and the width of the active area AA corresponds to W4 in FIG. 1.

As shown in FIG. 20, when the width of the active area AA is set within the range of about 15 to 19 nm, the effective channel width of the curved cell of this embodiment is about 23.5 to 30 nm, that of the conventional flat cell is about 15 to 19 nm, and that of the conventional curved cell is about 15 to 17.5 nm.

As described above, even when the width of the active area AA is decreased to about 15 to 19 nm, the curved cell of this embodiment can secure an effective channel width larger than those of the conventional curved cell and flat cell.

[4] Effective Width of Charge Storage Layer

Figure 21:
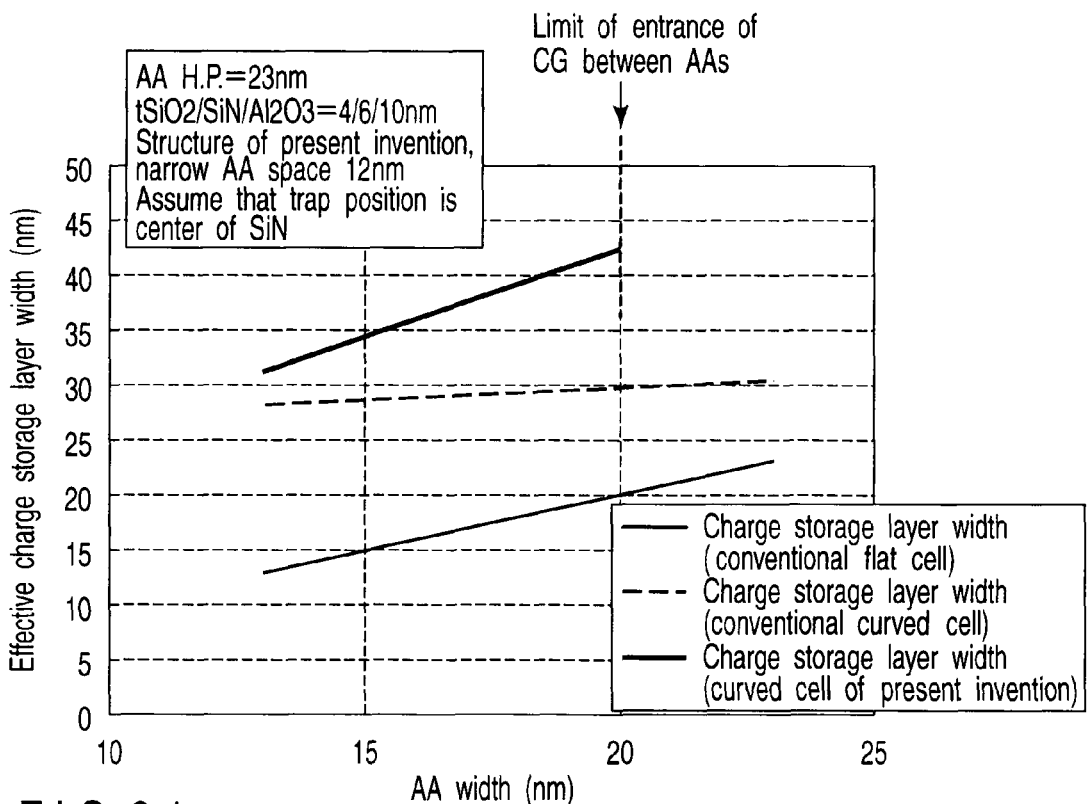
FIG. 21 is a graph showing the effective charge storage layer width as a function of the active area width, for each of the curved cell of the embodiment, the conventional curved cell, and the conventional flat cell.

FIG. 21 is a graph showing the effective width of the charge storage layer as a function of the active area width, for each of the curved cell of this embodiment, the conventional curved cell, and the conventional flat cell. The cells shown in FIG. 21 have the same film arrangement as that shown in FIG. 20. Note that the width of the charge storage layer corresponds to Y in FIG. 1, and the width of the active area AA corresponds to W4 in FIG. 1.

As shown in FIG. 21, when the width of the active area AA is set within the range of about 15 to 19 nm, the effective charge storage layer width of the curved cell of this embodiment is about 34 to 41 nm, that of the conventional flat cell is about 15 to 19 nm, and that of the conventional curved cell is about 29 to 29.5 nm.

As described above, even when the width of the active area AA is decreased to about 15 to 19 nm, the curved cell of this embodiment can ensure an effective charge storage layer width larger than those of the conventional curved cell and flat cell.

[5] Relative Potential Distributions of Gate Insulating Films

Figure 22:
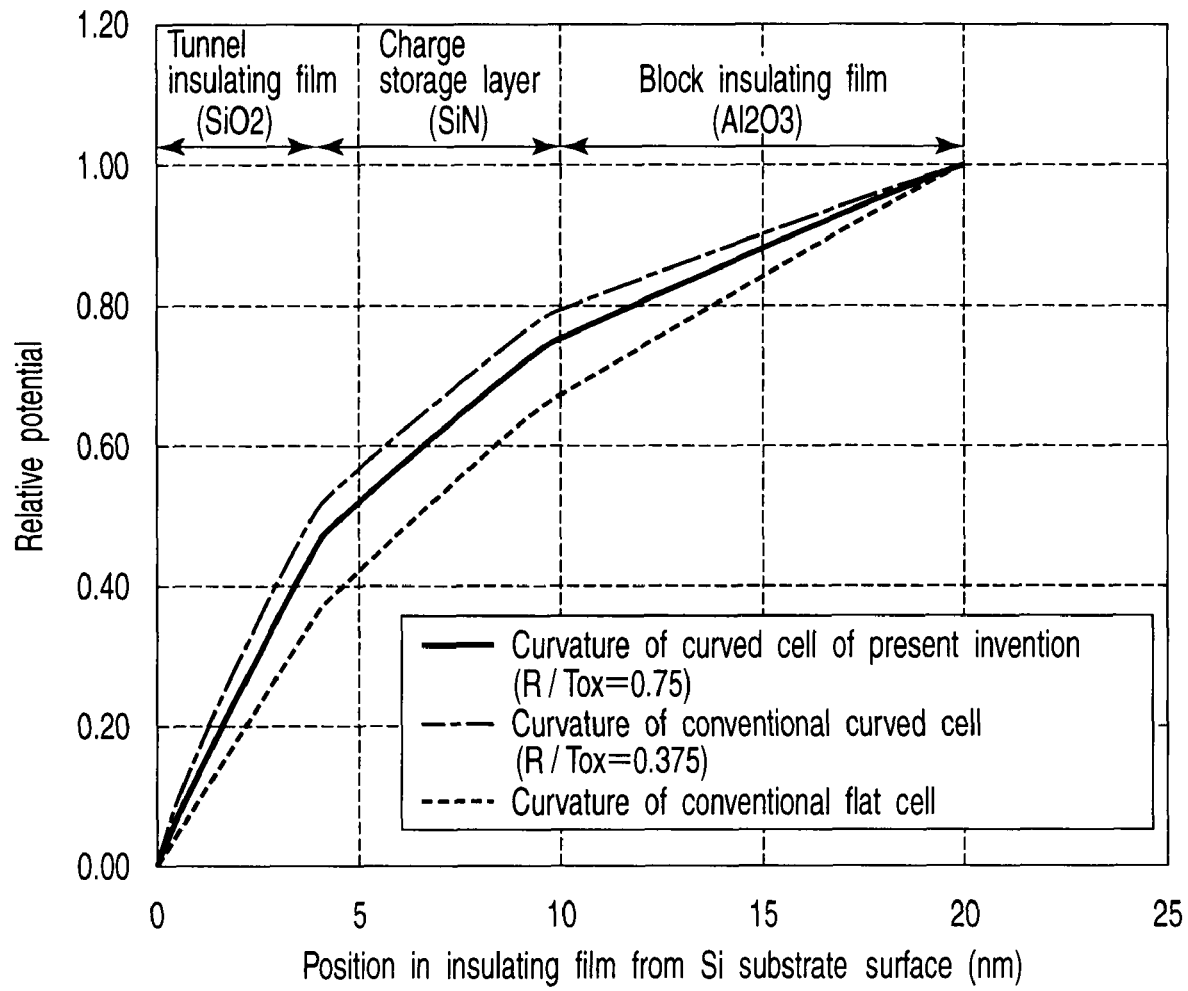
FIG. 22 is a graph showing the relative potential distributions of a tunnel insulating film, charge storage layer, and block insulating film when a positive voltage is applied to the control gate electrode during data write, for each of the curved cell of the embodiment, the conventional curved cell, and the conventional flat cell.

FIG. 22 is a graph showing the relative potential distributions of the tunnel insulating film, charge storage layer, and block insulating film when a positive voltage is applied to the control gate electrode during data write, for each of the curved cell of this embodiment, the conventional curved cell, and the conventional flat cell. An $SiO_2$ film is used as the tunnel insulating film, an SiN film is used as the charge storage layer, and an $Al_2O_3$ film is used as the block insulating film. The curvature of the curved cell of this embodiment is 0.75, and that of the conventional curved cell is 0.375.

As shown in FIG. 22, similar to the conventional curved cell, the curved cell of this embodiment can relatively strengthen an electric field to be applied to the tunnel insulating film and relatively weaken an electric field to be applied to the block insulating film, compared to the conventional flat cell. When writing data in, e.g., a NAND flash memory, electrons are injected into the charge storage layer by applying a positive voltage to the control gate electrode, and supplying an FN current to the tunnel insulating film. Even in a case like this, the voltage to be applied to the control gate electrode can be decreased such that the electric field to be applied to the tunnel insulating film is equal to that in the conventional flat cell, so the electric field to be applied to the block insulating film can also be decreased. This makes it possible to prevent the electrons injected into the charge storage layer from flowing into the control gate electrode at the end of data write at which the electric field to be applied to the block insulating film is maximum. Accordingly, a large number of electrons remain in the charge storage layer, so a high threshold value can be set for the cell. Likewise, the electric field to be applied to the block insulating film can be decreased when extracting electrons from the charge storage layer to the Si substrate or injecting holes from the Si substrate during data erase. Since the electric field to be applied to the block insulating film can be suppressed, therefore, the injection of electrons from the block insulating film is suppressed, so a deep threshold value can be erased. This makes it possible to increase the difference between the transistor threshold values in programming and erase.

As described above, this embodiment can prevent, by curving the channel portion, an intense electric field from being locally applied to the gate insulating film when programming a memory cell and erasing data from it. In addition, when compared to a flat cell, this embodiment can relatively strengthen an electric field to be applied to the tunnel insulating film, and relatively weaken an electric field to be applied to the block insulating film. Accordingly, it is possible to reduce leakage currents during programming and erase, and increase the difference between the transistor threshold values in programming and erase.

[6] Effects of Embodiment

In this embodiment, the first element isolation insulating film STI1 having the width W2 larger than the half pitch and the second element isolation insulating film STI2 having the width W3 smaller than the half pitch are alternately arranged, the upper surface of the first element isolation insulating film STI1 is made lower than that of the second element isolation insulating film STI2, and the channel portion is curved from the second element isolation insulating film STI2 toward the first element isolation insulating film STI1.

Consequently, the control gate electrode 28 can enter deeply above the first element isolation insulating film STI1 between adjacent active areas AA. This make it possible to increase the width X of the channel formed in the substrate by the electric field from the control gate electrode 28 and the width Y of the charge storage layer 26, so a large effective channel area and a large effective area of the charge storage layer 26 can be ensured. Accordingly, it is possible to apply a relatively intense electric field to the tunnel insulating film 25, and relatively weaken an electric field to be applied to the block insulating film 27 during data write and erase. Even when the cell is downsized, therefore, it is possible to increase the drain current and charge storage amount of the cell transistor STr and increase the data retention while maintaining the effect of the curved cell, i.e., the ability to increase the difference between the threshold values of the cell transistor STr in programming and erase.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate having a projection projecting from a substrate surface, an upper end portion of the projection being curved, and a root of the projection having a first width;
   a first element isolation insulating film formed on the substrate surface at the root of the projection, having an upper surface lower than an upper surface of the projection, and having a second width;
   a second element isolation insulating film formed in the projection, and having a third width smaller than the first width and the second width;
   a gate insulating film formed on the projection, and including a charge storage layer; and
   a gate electrode formed on the gate insulating film,
   wherein a height of a first portion where the gate electrode is in contact with the gate insulating film above the upper surface of the first element isolation insulating film is smaller than that of a second portion where the gate electrode is in contact with the gate insulating film above an upper end of the second element isolation insulating film.

2. The device according to claim 1, wherein the gate insulating film includes:
   the charge storage layer; and
   a first oxide film and a second oxide film sandwiching the charge storage layer.

3. The device according to claim 1, wherein the gate insulating film includes:
   the charge storage layer made of a silicon nitride film; and
   a silicon oxide film and an Al oxide film sandwiching the charge storage layer.

4. The device according to claim 1, wherein the height of the first portion is lower than that of the upper surface of the projection.

5. The device according to claim 1, wherein 2-bit memory cells isolated by the second element isolation insulating film are formed for the projection.

6. The device according to claim 1, wherein a film thickness of the gate insulating film in the first portion is smaller than that of the gate insulating film in the second portion.

7. The device according to claim 1, wherein
   the gate insulating film in the first portion has a two-layered structure including the charge storage layer and a first insulating film, and
   the gate insulating film in the second portion has a three-layered structure including the charge storage layer, and the first insulating film and a second insulating film sandwiching the charge storage layer.

8. The device according to claim 7, wherein the charge storage layer is in direct contact with the first element isolation insulating film.

9. The device according to claim 1, wherein
   the gate insulating film includes:
   the charge storage layer;
   a first oxide film formed between the charge storage layer and the semiconductor substrate; and
   a second oxide film formed between the charge storage layer and the gate electrode, and
   a film thickness of the second oxide film is larger than that of the charge storage layer, and the film thickness of the charge storage layer is larger than that of the first oxide film.

10. The device according to claim 9, wherein the first oxide film is formed on only the upper surface of the projection and the upper surface of the second element isolation insulating film.

11. The device according to claim 1, wherein depths of bottom surfaces of the first element isolation insulating film and the second element isolation insulating film are the same.

12. A semiconductor memory device manufacturing method comprising:
    forming a first element isolation trench having a first width in a semiconductor substrate;
    forming a projection having a curved upper end portion by oxidizing a surface of the semiconductor substrate;
    burying a first element isolation insulating film in the first element isolation trench;
    forming a second element isolation trench having a second width smaller than the first width in the projection;
    burying a second element isolation insulating film in the second element isolation trench;
    removing upper portions of the first element isolation insulating film and the second element isolation insulating film, making an upper surface of the first element isolation insulating film lower than that of the second element isolation insulating film;
    forming a gate insulating film on the projection, the first element isolation insulating film, and the second element isolation insulating film; and
    forming a gate electrode on the gate insulating film;
    wherein a height of a first portion where the gate electrode is in contact with the gate insulating film above the upper surface of the first element isolation insulating film is smaller than that of a second portion where the gate electrode is in contact with the gate insulating film above an upper end of the second element isolation insulating film.

13. The method according to claim 12, further comprising:
    forming a first mask on the semiconductor substrate;
    forming the first element isolation trench by using the first mask;
    forming the first element isolation insulating film with the first mask being left behind;
    planarizing the first element isolation insulating film until the first mask is exposed;
    forming a trench on the projection by removing the first mask;
    forming second masks on side surfaces of the trench;
    forming the second element isolation trench in the projection by using the second masks; and
    removing the second masks.

14. The method according to claim 13, wherein an upper surface of the projection is exposed by removing the first mask.

15. The method according to claim 14, further comprising forming a Silicon oxide film by oxidizing the exposed upper surface of the projection.

16. The method according to claim 15, further comprising removing the Silicon oxide film before forming the gate insulating film.

17. The method according to claim 12, wherein the forming process of the gate insulating film comprises:
- forming a first insulating film on the projection;
- forming a charge storage layer on the first insulating film and the first and second element isolation insulating films; and
- forming a second insulating film on the charge storage layer.

18. The method according to claim 13, further comprising:
- selectively etching the upper portion of the first element isolation insulating film after forming the second element isolation trench.

19. The method according to claim 18, wherein the upper portions of the first element isolation insulating film and the second element isolation insulating film are removed at the same time after selectively etching the upper portion of the first element isolation insulating film.

20. The method according to claim 19, wherein a removing process of the upper portions of the first element isolation insulating film and the second element isolation insulating film at the same time comprises making the upper portion of the first element isolation insulating film lowered to a lower edge of a curved portion of the projection and making the upper portion of the second element isolation insulating film lowered to an upper edge of the curved portion of the projection.

\* \* \* \* \*